(12) United States Patent
Lin et al.

(10) Patent No.: US 6,445,008 B1
(45) Date of Patent: Sep. 3, 2002

(54) PHOTO SENSING DEVICE AND THE MANUFACTURING METHOD THEREOF

(75) Inventors: Ming-Der Lin; Feng Ju Chuang; Wen Liang Tseng, all of Hsinchu; Chia Chen Chang, Ilan, all of (TW)

(73) Assignee: Opto Tech Corporation, Hsin Chu (TW)

( * ) Notice: Subject to any disclaimer, the term of this patent is extended or adjusted under 35 U.S.C. 154(b) by 0 days.

(21) Appl. No.: 09/983,566

(22) Filed: Oct. 25, 2001

(51) Int. Cl.[7] .......................... H01L 27/15; H01L 31/12; H01L 33/00
(52) U.S. Cl. ......................................... 257/82; 257/100
(58) Field of Search ................................... 257/82, 100

(56) References Cited

U.S. PATENT DOCUMENTS

| | | | | |
|---|---|---|---|---|
| 3,727,064 A | * | 4/1973 | Bottini | 259/217 |
| 4,412,135 A | * | 10/1983 | Kashihara | 250/551 |
| 5,164,930 A | * | 11/1992 | Sugiura | 369/44 |
| 5,171,985 A | * | 12/1992 | Kawaguchi | 250/239 |
| 6,060,337 A1 | * | 5/2002 | Kobachi et al. | 438/64 |
| 2002/0026108 A1 | * | 2/2002 | Colvin, Jr. | 699/316 |

* cited by examiner

*Primary Examiner*—Olik Chaudhuri
*Assistant Examiner*—William C Vesperman
(74) *Attorney, Agent, or Firm*—Rosenberg, Klein & Lee

(57) ABSTRACT

A photo sensing device uses surface-emitting LED as light emitter to increase responsive of light receiver and prevent the short circuit of connection wires, and the manufacturing method thereof. The light emitter is directly mounted on top front surface of an encapsulating epoxy enclosing a light receiver. The light emitted from backside of the light emitter passes through the encapsulating epoxy and is directly absorbed by the light receiver. The response is enhanced as compared with prior art.

34 Claims, 11 Drawing Sheets

PHOTO SENSING DEVICE AND THE MANUFACTURING METHOD THEREOF

FIELD OF THE INVENTION

The present invention relates to a photo sensing device and the manufacturing method thereof, especially to a photo sensing device using surface-emitting LED as light source to increase responsive of photo receiver and prevent the short circuit of connection wires, and the manufacturing method thereof.

BACKGROUND OF THE INVENTION

The photo sensing devices such as photo couplers, photo sensors are extensively used in optical-based signal transmission system such as fiber communication, mouse or computer control systems. For examples, the related technologies are disclosed in Taiwan Pat. No. 254484 with title "Photo coupler device" and 289804 with title "Photo coupler apparatus"

FIG. 1A shows a top view of prior art photo sensing device and FIG. 1B shows a sectional view along line A—A in FIG. 1A. The photo sensing device, such as a photo coupler, comprises at least a light emitter 13 (for example, a light emitting diode, LED) and a light receiver 15 (for example, a photo diode, PD). The light emitter 13 and the light receiver 15 are fixed to two separate inner lead 139 (fourth inner lead) and inner lead 159 (first inner lead) of a leadframe. The LED 13 is connected to a sixth inner lead 137 through a connection wire 135. The anode and cathode of the PD 15 are connected to second inner lead 151 and third inner lead 157 through connection wires 153 and 155. Moreover, a semi-sphere encapsulating epoxy 17 and a sealing shell 11 are covered on the LED 13, the LD 15 and the connection wires 135, 153 and 155 to prevent short circuit of the connection wires. As indicated by the phantom line, the light generated by the LED 13 is received by the PD 15 to generate corresponding electric signal.

However, in above photo sensing device, the most light received by the PD 15 is reflection light of the LED 13. The response of the photo sensing device is deteriorated.

FIG. 2 shows a sectional view of another prior art photo sensing device, wherein the fourth inner lead 239 of the leadframe is modified to lift the position of the LED 23. The LED 23 is placed on the PD 25 mounted on the first inner lead 259. Therefore, the light-receiving area of the PD 25 is increased and the response of the photo sensing device is enhanced.

However, in above photo sensing device, the distance between the LED 25 and the PD 23 is critical. The voltage endurance and isolation is poor when the encapsulating epoxy is excessively thin. The photo response is not satisfactory when the encapsulating epoxy is excessively thick. Moreover, the encapsulating epoxy is formed after the PD 25 and the LED 23 are mounted, therefore, the connection wires 235 and 255 have the risk of short circuit.

It is an object of the prevent invention to provide a photo sensing device having an encapsulating epoxy with easily adjustable height. The voltage durability and photo response are enhanced It is another object of the prevent invention to provide a photo sensing device, wherein the photo emitter can be easily mounted and the height of the photo emitter can be easily controlled.

In one aspect of the present invention, a surface-emitting LED with anode and cathode on same surface is mounted on a top front surface of an encapsulating epoxy. The light of the surface-emitting LED can be directly received by a photo receiver and the photo response is enhanced.

In another aspect of the present invention, the photo receiver and the connection wires thereof are enclosed by an encapsulating epoxy and then the photo emitter is mounted on the encapsulating epoxy, the short circuit problem is prevented.

The various objects and advantages of the present invention will be more readily understood from the following detailed description when read in conjunction with the appended drawing, in which:

DETAIL DESCRIPTION OF PREFERRED EMBODIMENT

Figure 1A:
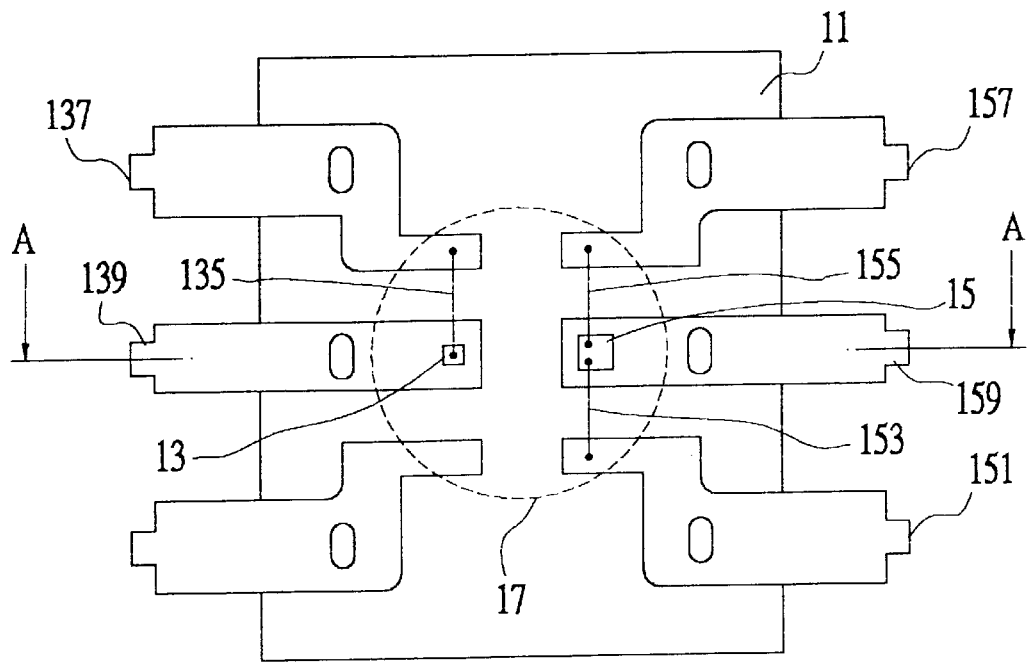
FIG. 1A shows a top view of prior art photo sensing device.
Figure 1B:
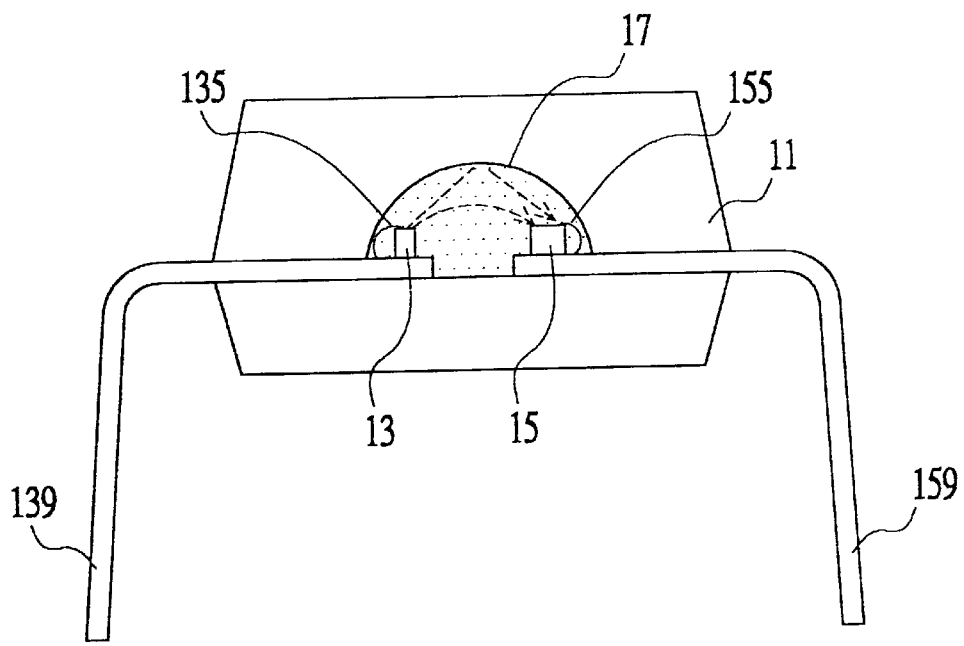
FIG. 1B shows a sectional view along line A—A in FIG. 1A.
Figure 2:
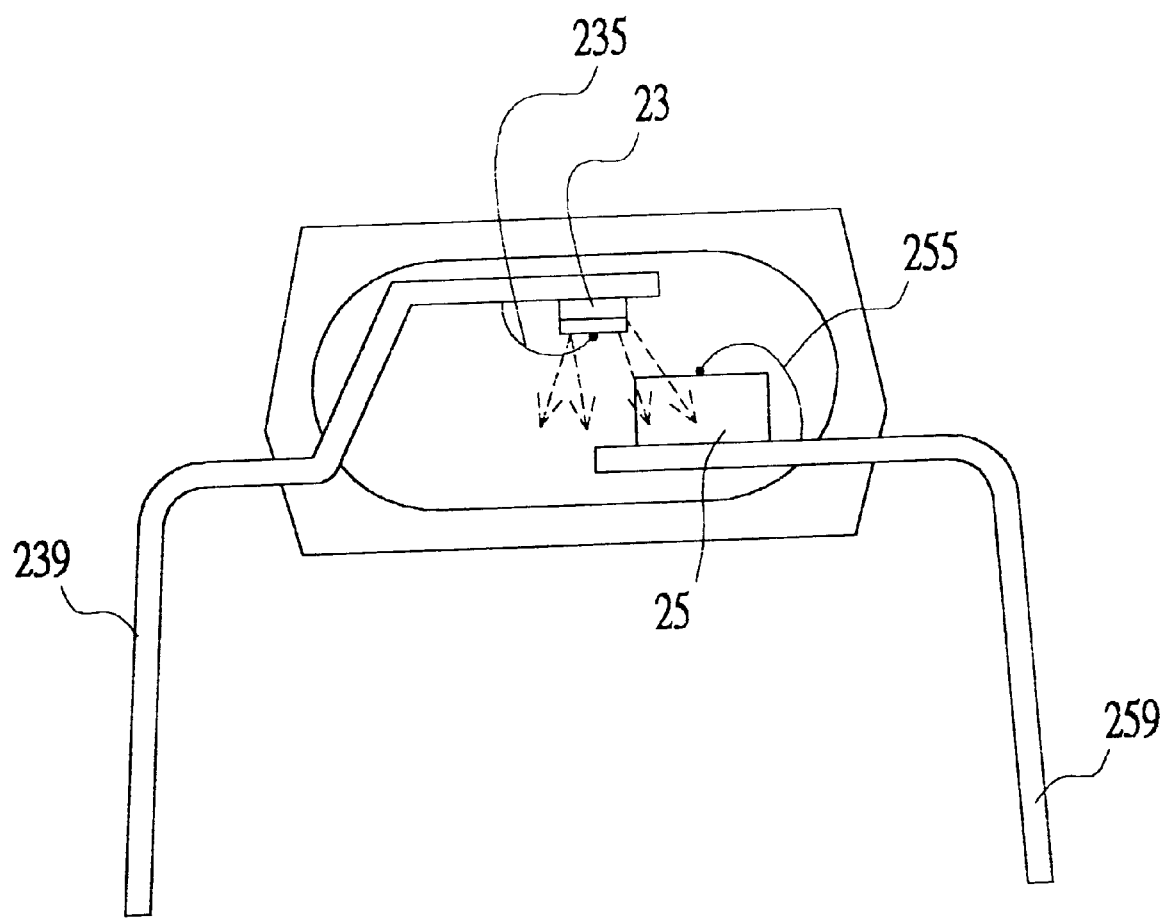
FIG. 2 shows a sectional view of another prior art photo sensing device.
Figure 3A:
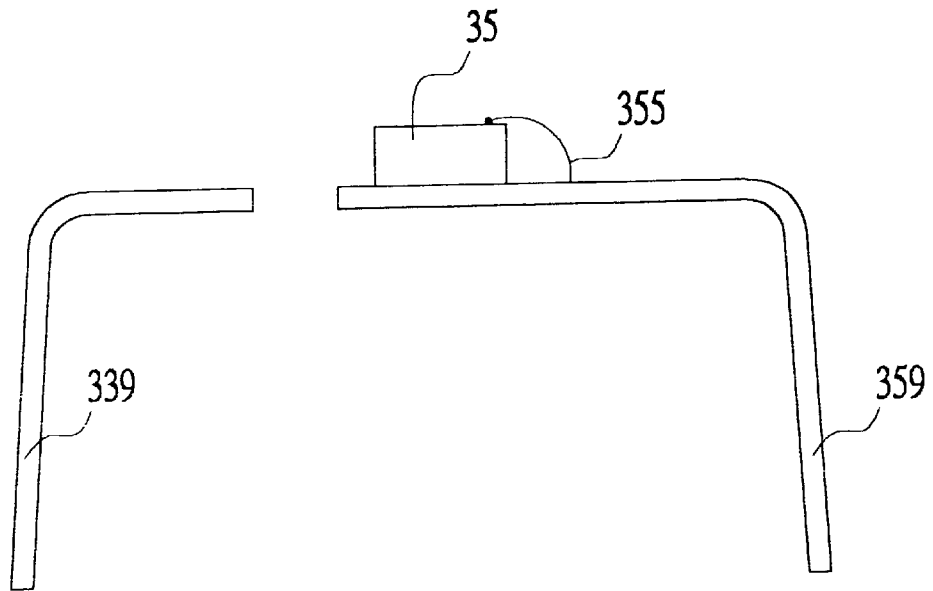
FIGS. 3A to 3E show the manufacturing procedure of a photo sensing device according to the first preferred embodiment of the invention.
Figure 3B:
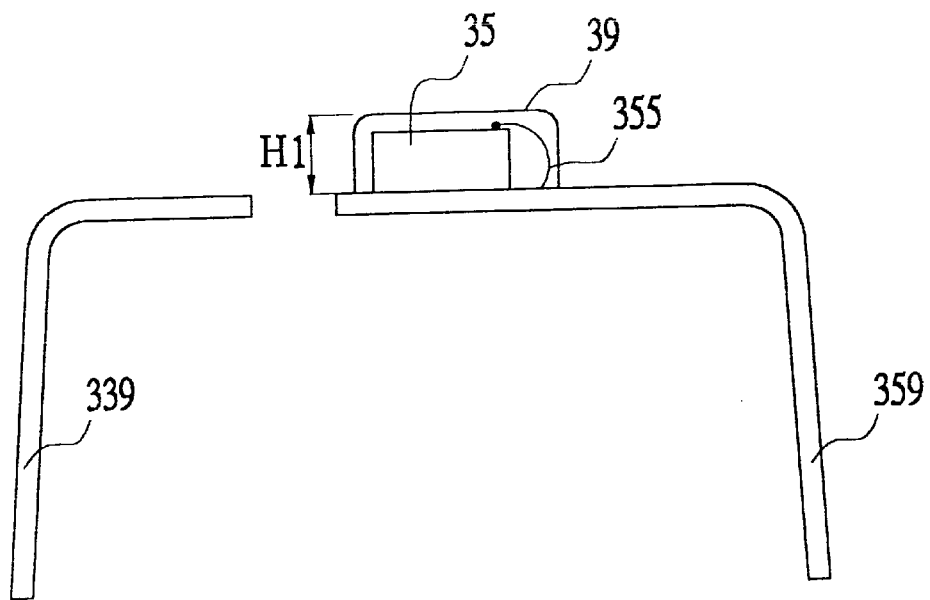
Figure 3C:
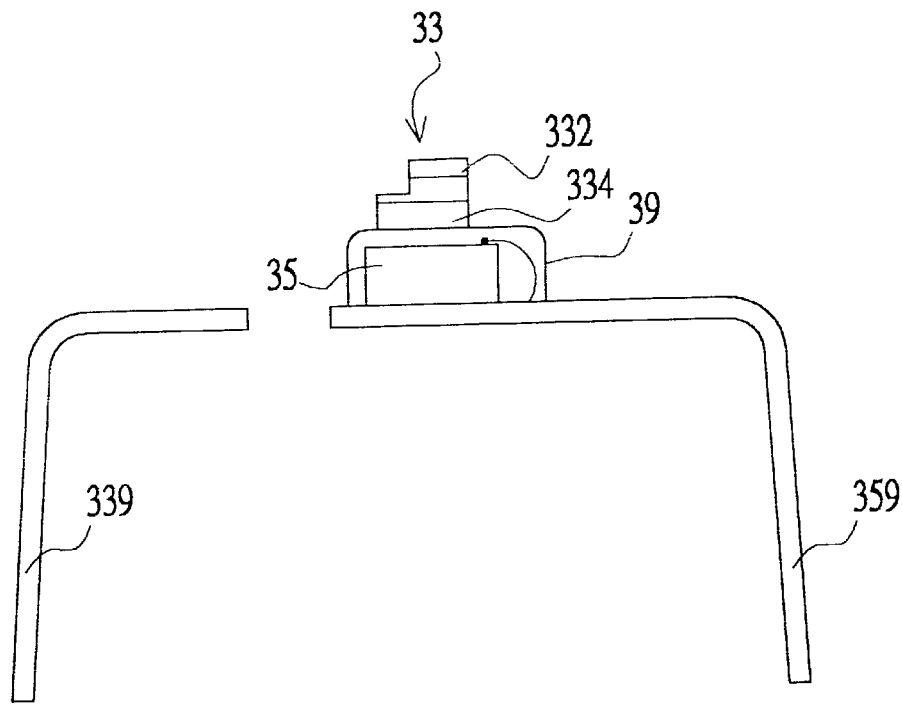
Figure 3D:
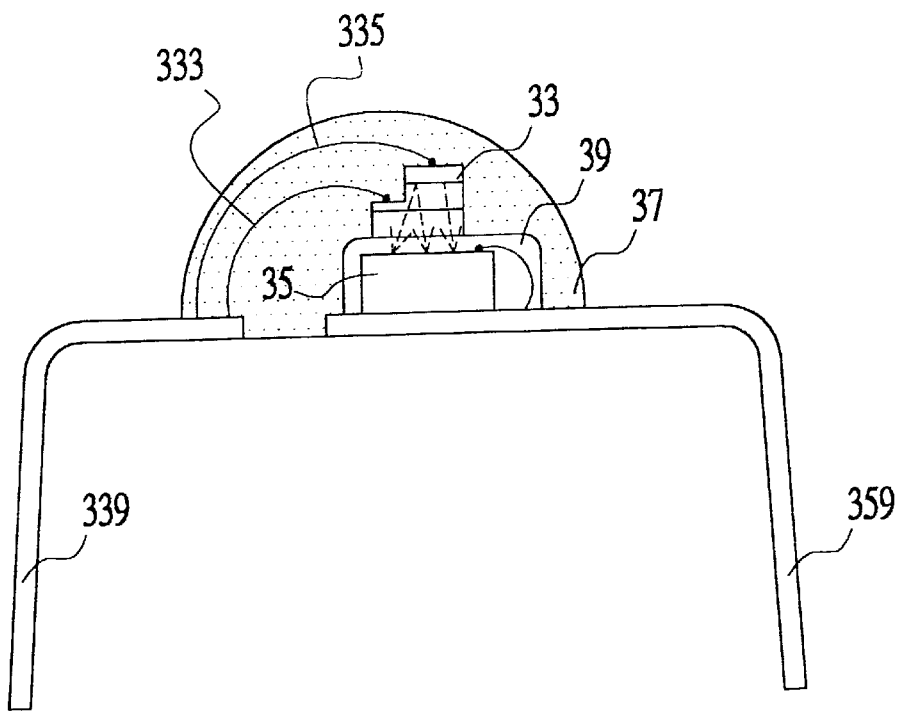
Figure 3E:
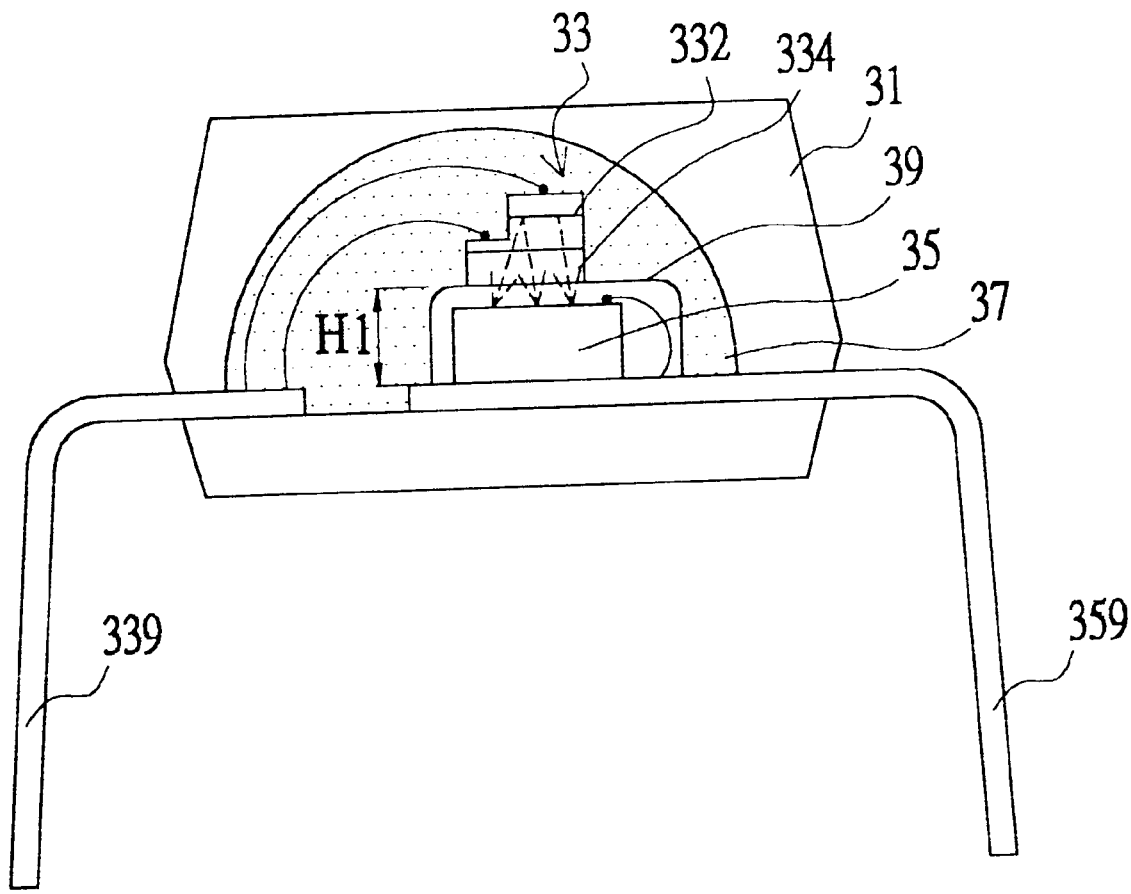
Figure 4A:
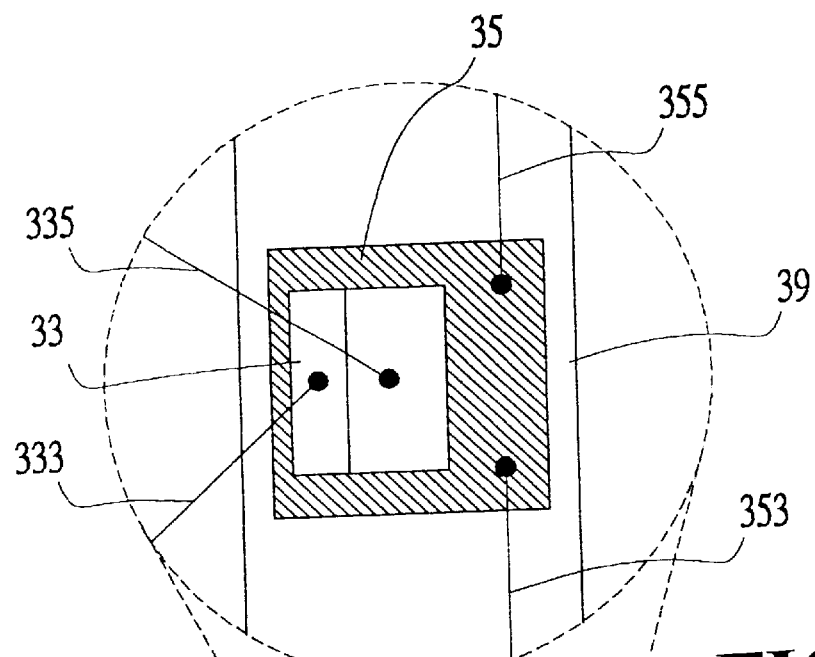
FIG. 4A shows the partially enlarged view of the present invention along line B—B in FIG. 4.
Figure 4:
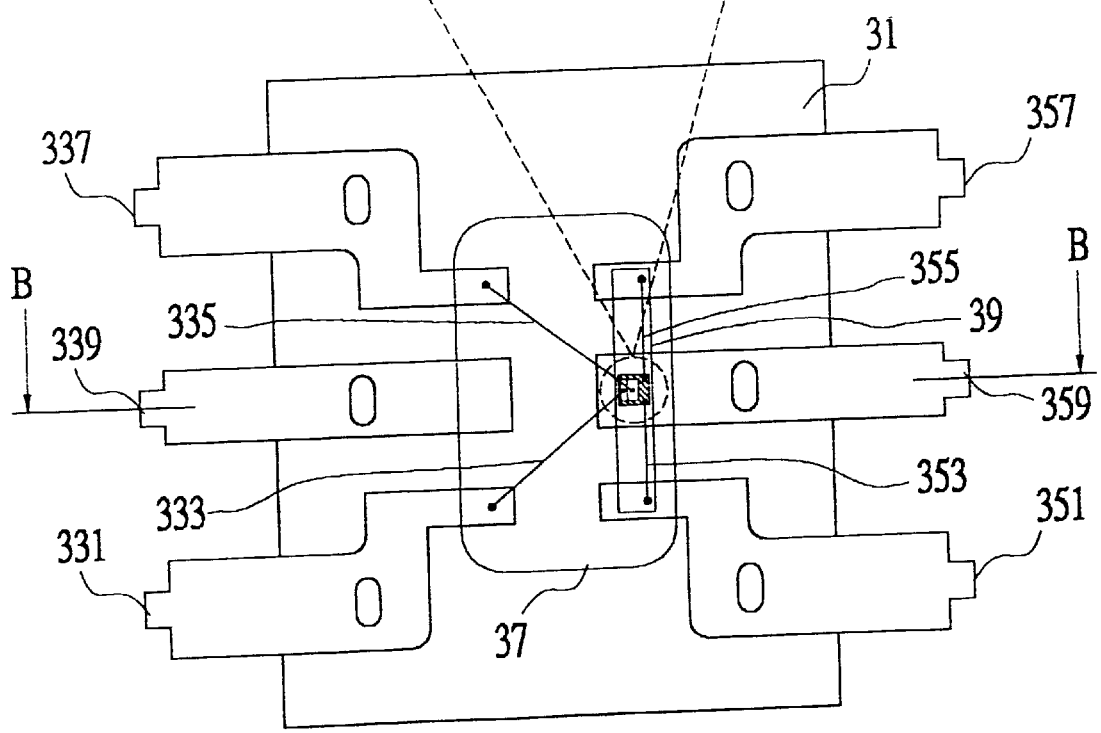
FIG. 4 shows the sectional view of the photo sensing device of the invention.

FIGS. 3A to 3E and FIG. 4 show the manufacturing procedure of a photo sensing device according to the first preferred embodiment of the invention and the sectional view of the photo sensing device. In the first preferred embodiment, a photo diode (PD) 35 is fixed on a first inner lead 359 of a leadframe, and the anode and the cathode of the PD 35 are connected to a second inner lead 351 and a third inner 357 of the leadframe through a connection wire 353 and a connection wire 355, respectively, as shown in FIG. 3A and FIG. 4.

Afterward, an encapsulating epoxy 39 is applied to cover the PD 35 and the connection wires 353 and 355 for isolation, the encapsulating epoxy 39 is made of polymeric monomer such as epoxy resin, glass, methyl acrylic resin. As shown in FIG. 3B, the height H1 of the encapsulating epoxy 39 can be adjusted according to practical need.

Afterward, a light emitter 33 is mounted on front surface of the encapsulating epoxy 39 and preferably atop of the PD 35, as shown in FIG. 3C. The present invention is characterized in that the light emitter 33 is a surface-emitting LED with anode and cathode on same plane and soldered to two connection wires 333 and 335, respectively. The surface-emitting LED 33 comprises a substrate 334 of GaAs or GaP and an epitaxial layer 332 formed on top of the substrate 334.

The connection wires 333 and 335 connected to the surface-emitting LED 33 are connected to a fifth inner lead 331 and sixth inner lead 337 separated with the second inner lead 351 and the third inner lead 357, as shown in FIG. 3D. Therefore, the four connection wires are connected to inner leads on four corners of the leadframe to reduce the interference.

As shown in FIG. 3E, a sealing shell 31 or a second encapsulating epoxy 37 is used to encapsulate the PD 35, the encapsulating epoxy 39 and the surface-emitting LED 33 and part of the leadframe to reduce signal interference.

The epitaxial layer 332 of the surface-emitting LED 33 is energized through the fifth inner lead 331 and the sixth inner lead 337 and generates light in omni-direction. The omnidirectional light passes through substrate 334 and the encapsulating epoxy 39 and is then absorbed directly by the PD 35 as indicated by the phantom arrows. Therefore, the response is enhanced as compared with prior art wherein the light is reflected and then absorbed.

With reference now to FIG. 4 and 4A, those figures show the top view and partially enlarged view of the present invention. The light emitter in the present invention is a surface-emitting LED 33 and the back-side light thereof is not blocked by the bonding pads and the wires 333 and 335. The photo response is enhanced. Moreover, the connection wires 333 and 335 of the LED 33 are extended toward the fifth inner lead 331 and the sixth inner lead 337 on one side of the leadframe and the connection wires 353 and 355 of the PD 35 are extended toward the second inner lead 351 and the third inner lead 357 on another side of the leadframe. Moreover, the connection wires 333 and 335 and the connection wires 353 and 355 are separated by the second encapsulating epoxy 37. The short circuit problem of the connection wires is prevented. For different photo detector 35, the first inner lead can be replaced by the second inner lead or the third inner lead.

Figure 5:
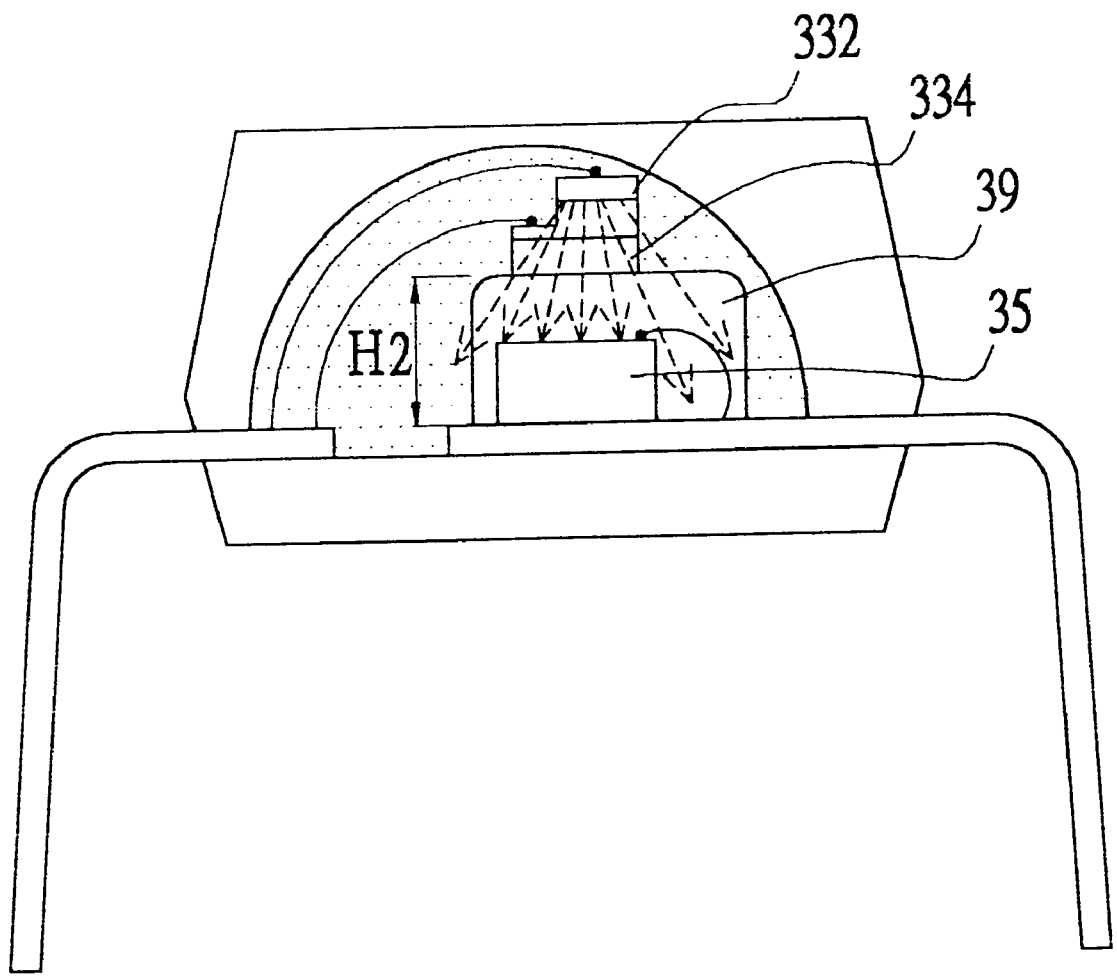
FIG. 5 shows another preferred embodiment of the present invention.

FIG. 5 shows another preferred embodiment of the present invention. This preferred embodiment is different to that in FIG. 3E where the height H2 of the encapsulating epoxy 39 is considerably larger than the height H1 shown in FIG. 3E. therefore, the light emitted from single LED 33 can be received by a plurality of PD 35, the design flexibility is enhanced.

With reference now to FIGS. 6A to 6E and FIG. 4, those figures show manufacture procedures of another preferred embodiment of the present invention.

Figure 6A:
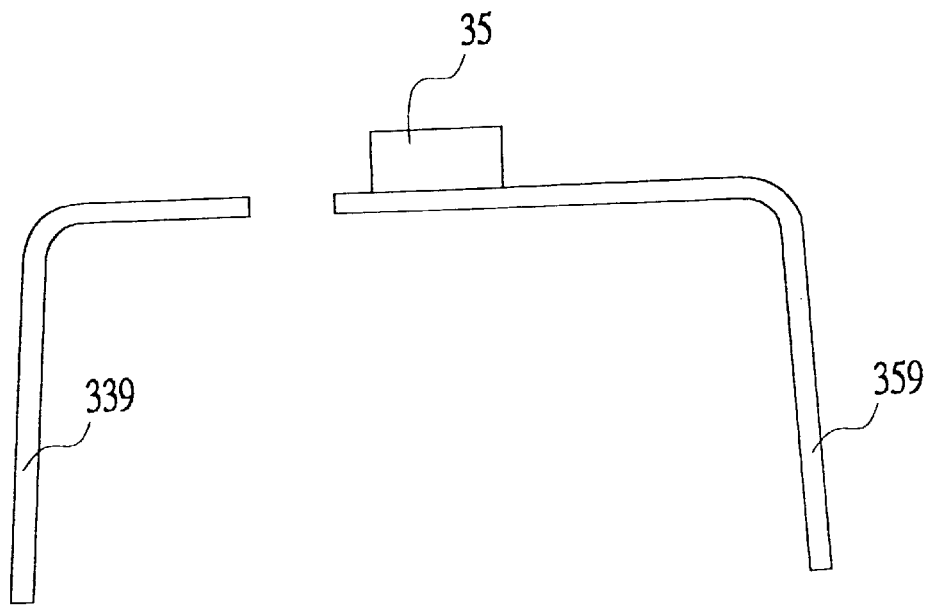
FIGS. 6A to 6E show manufacture procedures of another preferred embodiment of the present invention.

As shown in FIG. 6A, a PD 35 is fixed on a first inner lead 359 of a leadframe.

Figure 6B:
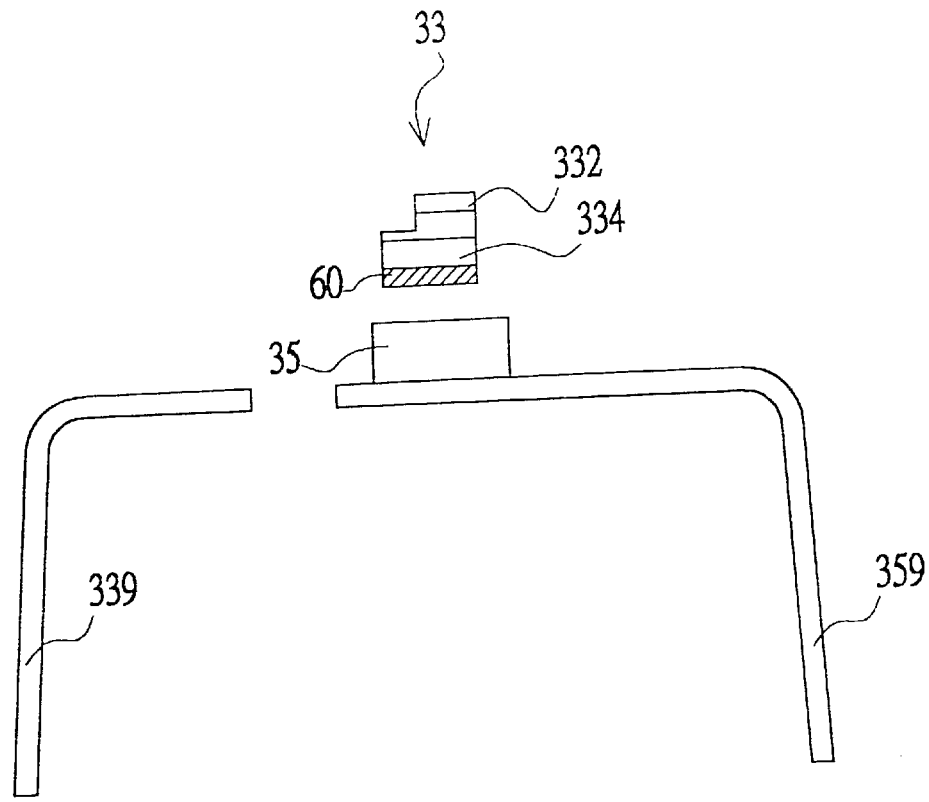

As shown in FIG. 6B, a light emitter 33 with a substrate 334 and an epitaxial layer 332 is prepared and the bottom of the substrate 334 has a binding layer 60.

Figure 6C:
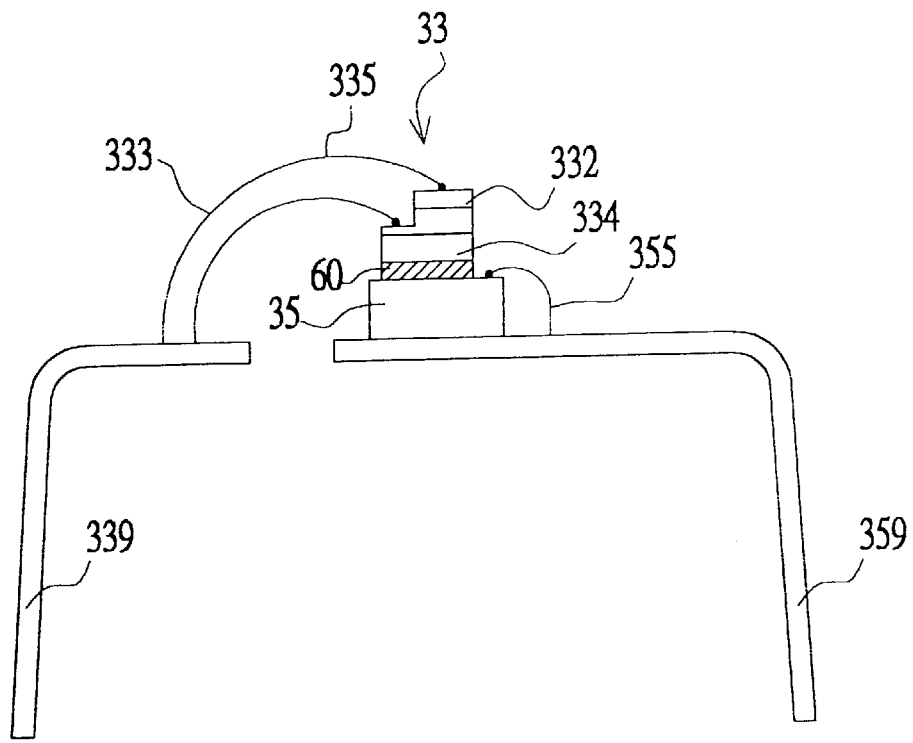

The light emitter 33 with the binding layer 60 is mounted on top surface of the PD 35; and the light emitter 33 and the PD 35 are connected to corresponding inner leads through connection wires 333, 335 and 355, as shown in FIG. 6C, the connection wires 333, 335 and 355 are connected to inner leads on comers of the leadframe, the short circuit problem is prevented.

Figure 6D:
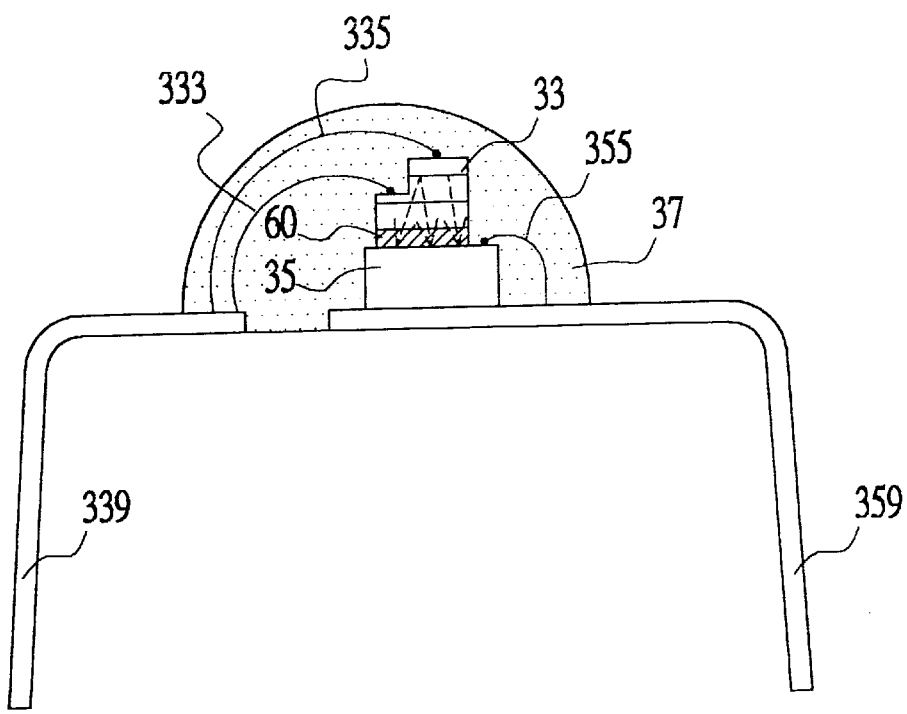
Figure 6E:
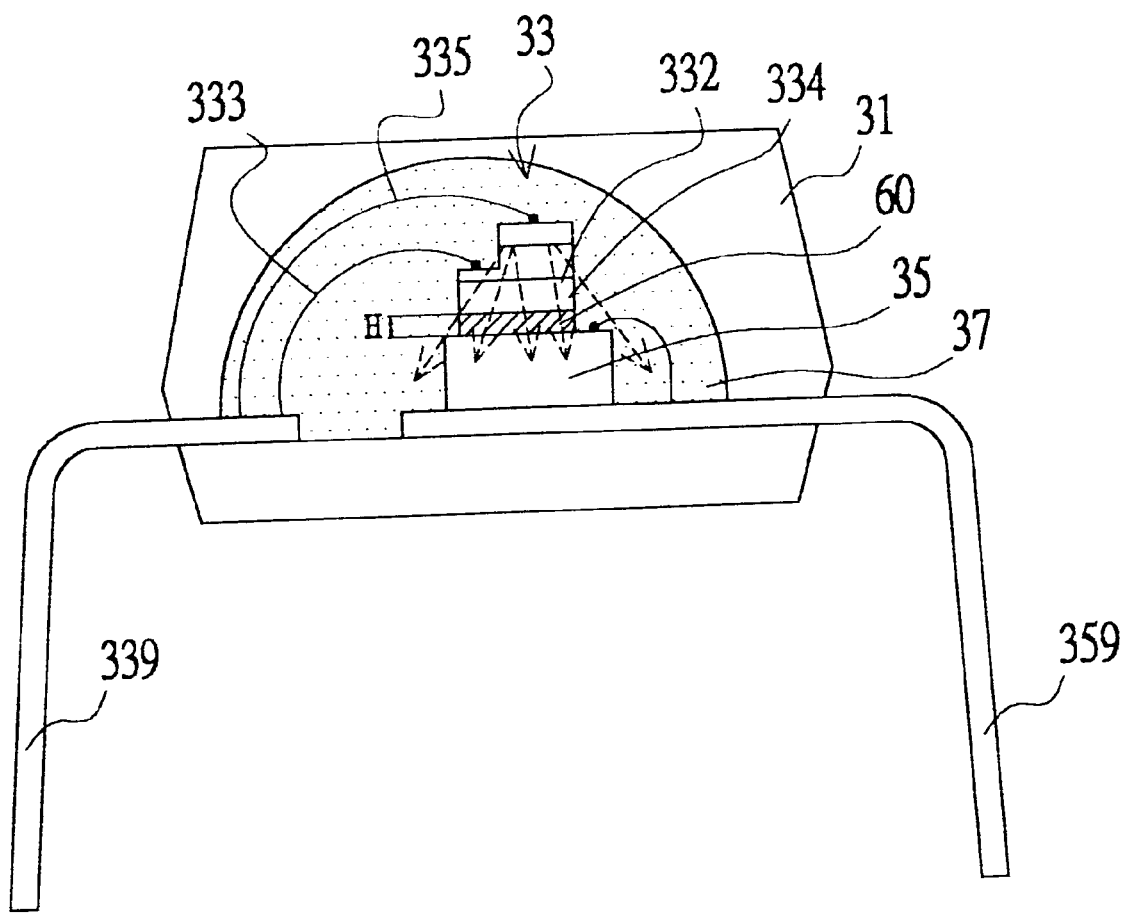

Afterward, as shown in FIG. 6D, a semi-sphere encapsulating epoxy 37 is used to enclose the light emitter 33, the PD 35 and the connection wires 333, 335 and 355.

As shown in FIG. 3E, a sealing shell 31 is provide to encapsulate the light emitter 33, the PD 35, the binding layer 60 and part of the leadframe, thus preventing the signal interference.

When the epitaxial layer 332 generates light in omni direction, the back side light pass through the substrate 334 and the binding layer 60 and then is absorbed by the PD 35 without being absorbed by the bonding pads and the connection wires. The height of the binding layer 60 can be adjusted according to practical situation. Moreover, the light emitter 33 can be vertical-emitting LED instead of surface-emitting LED.

Moreover, the binding layer 60 can be firstly arranged on top surface of the PD 35 and then the light emitter 33 is attached on top of the binding layer 60.

Figure 7:
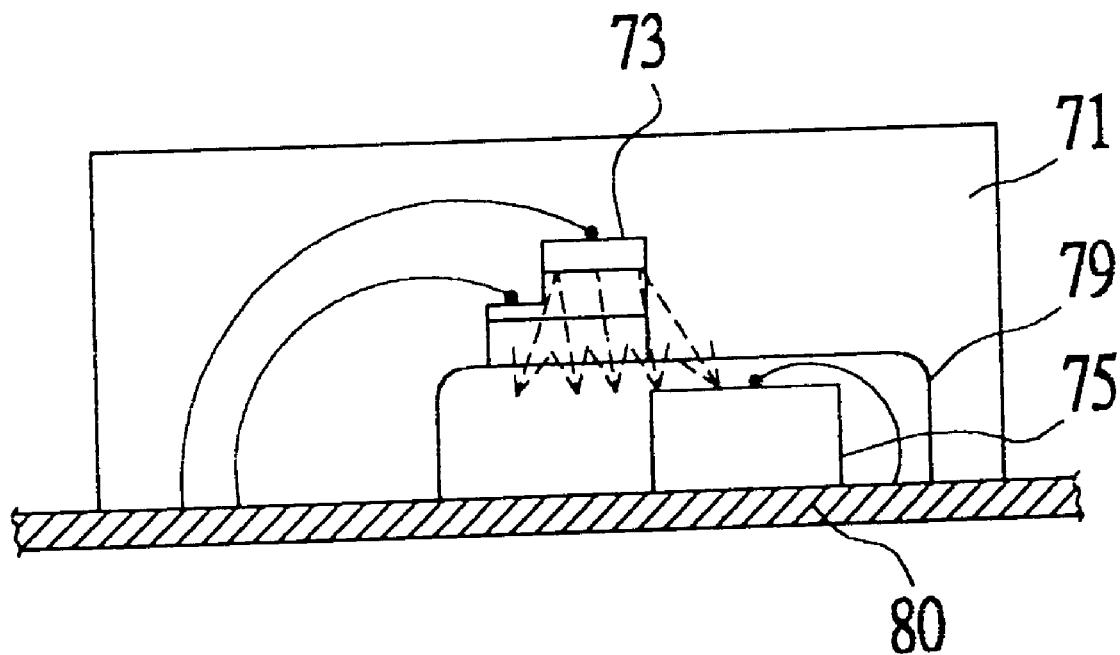
FIG. 7 shows a sectional view of still another preferred embodiment of the present invention.

FIG. 7 shows a sectional view of still another preferred embodiment of the present invention. The light emitter 73 is placed on top of a PD 75 and separated with the PD 75 by an encapsulating epoxy 79. It is noted that the light emitter 73 is not placed right on top of a PD 75, i.e., not placed on vertical extension line from the PD 75. In this situation, the backside light of the light emitter 73 can also be received by the PD 75. As shown in this figure, all above mentioned elements are enclosed by a second encapsulating epoxy 71. Moreover, the PD 75 can be a component of an IC circuit 80, or a photo detector connected to a sensing device, a microprocessor, a PCB or a chipset. Moreover, the leadframe can be component of an IC circuit, a chipset, a PCB or a microprocessor, or component of assemble of above units.

To sum up, the photo sensing device according to the present invention provides a photo sensing device using surface-emitting LED as light source. The responsive of photo receiver is increased and the short circuit of connection wires can be prevented. Moreover, the above-mentioned preferred embodiments are intended for description, not limitation of the present invention. The light source of the photo sensing device according to the present invention can be infrared in stead of visible light, and the materials of the encapsulating epoxy and the binding layer are also suitably modified for infrared light source.

I claim:

1. A photo sensing device comprising:
at least one light receiver each arranged on a first inner lead of a leadframe; the light receiver having an anode and a cathode connected to a second inner lead and a third inner lead through conductive wires;
an encapsulating epoxy enclosing the light receiver; and
a light emitter arranged on front top surface of the encapsulating epoxy; the light emitter having an anode and a cathode connected to a fifth inner lead and a sixth inner lead through conductive wires; the light emitted from a backside of the light emitter passing through the encapsulating epoxy and detected by the light receiver.

2. The photo sensing device as in claim 1, wherein the light emitter is arranged on vertical extension line from the light receiver.

3. The photo sensing device as in claim 1, wherein the light emitter is a surface-emitting LED with coplanar anode and cathode.

4. The photo sensing device as in claim 1, wherein the encapsulating epoxy is made material transparent to light emitted from the light emitter.

5. The photo sensing device as in claim 1, farther comprising a sealing shell to cover the light emitter, the encapsulating epoxy, the light detector, and part of the leadframe.

6. The photo sensing device as in claim 5, wherein the second inner lead and the third inner lead are located at one side of leadframe within the sealing shell; and the fifth inner lead and the sixth inner lead are located at opposed side of leadframe within the sealing shell.

7. The photo sensing device as in claim 5, wherein the thickness of the encapsulating epoxy depends on the designed spreading range of light emitted from the light emitter.

8. The photo sensing device as in claim 1, wherein the encapsulating epoxy is made of polymeric monomer.

9. The photo sensing device as in claim 1, further comprising a second encapsulating epoxy arranged within the sealing shell and covering the light emitter, the encapsulating epoxy, the light detector, and part of the leadframe.

10. The photo sensing device as in claim 1, wherein the encapsulating epoxy is a binding layer arranged on bottom of the light emitter and the binding layer together with the light emitter are directly fixed on top of the light receiver.

11. The photo sensing device as in claim 10, wherein the binding layer is made of adhesive material.

12. The photo sensing device as in claim 1, wherein the encapsulating epoxy is a binding layer arranged on top of the light receiver and the light emitter is then attached on top of the binding layer.

13. The photo sensing device as in claim 10, wherein the binding layer is made material transparent to light emitted from the light emitter.

14. The photo sensing device as in claim 1, wherein the first inner lead can be replaced by the second inner lead or the third inner lead.

15. The photo sensing device as in claim 1, wherein the light receiver can be directly mounted on an IC circuit, a chipset, a printed circuit board or a microprocessor or the combination thereof.

16. The photo sensing device as in claim 14, wherein the leadframe can be component of an IC circuit, a chipset, a PCB or a microprocessor, or component of combination thereof.

17. The photo sensing device as in claim 1, wherein the encapsulating epoxy directly encloses the connection wires connected to the second inner lead and third inner lead.

18. A method for manufacturing a photo sensing device, comprising following steps:
(a) mounting a light receiver on a first inner lead of a leadframe and connecting an anode and a cathode of the light receiver to a second inner lead and a third inner lead of the leadframe by connection wires;
(b) providing an encapsulating epoxy enclosing the light receiver and the connection wires;
(c) providing a light emitter on top front surface of the encapsulating epoxy;
(d) connecting an anode and a cathode of the light emitter to a fifth inner lead and a sixth inner lead of the leadframe by connection wires.

19. The method for manufacturing a photo sensing device as in claim 18, wherein the light emitter is a surface-emitting LED with coplanar anode and cathode.

20. The method for manufacturing a photo sensing device as in claim 18, wherein the thickness of the encapsulating epoxy depends on the designed spreading range of light emitted from the light emitter.

21. The method for manufacturing a photo sensing device as in claim 18, further comprising a step after step (d):
providing a sealing shell to cover the light emitter, the encapsulating epoxy, the light receiver, and part of the leadframe.

22. The method for manufacturing a photo sensing device as in claim 18, wherein the encapsulating epoxy is made material transparent to light emitted from the light emitter.

23. The method for manufacturing a photo sensing device as in claim 18, wherein the light emitter is arranged on vertical extension line from the center of the light receiver.

24. The method for manufacturing a photo sensing device as in claim 18, further comprising a step after step (d):
providing a second encapsulating epoxy arranged within the sealing shell and covering the light emitter, the encapsulating epoxy, the light receiver, and part of the leadframe.

25. The method for manufacturing a photo sensing device as in claim 18, wherein the leadframe can be component of an IC circuit, a chipset, a PCB or a microprocessor, or component of combination thereof.

26. A method for manufacturing a photo sensing device, comprising following steps:
(a) mounting a light receiver on a first inner lead of a leadframe;
(b) providing a light emitter with a binding layer attached on bottom thereof;
(c) arranging the light emitter with the binding layer on top front surface of the light receiver; and
(d) connecting an anode and a cathode of the light emitter to a fifth inner lead and a sixth inner lead of the leadframe by connection wires; and connecting an anode and a cathode of the light receiver to a second inner lead and a third inner lead of the leadframe by connection wires.

27. The method for manufacturing a photo sensing device as in claim 26, wherein the light emitter is a surface-emitting LED with coplanar anode and cathode.

28. The method for manufacturing a photo sensing device as in claim 26, further comprising a step after step (d):
providing a sealing shell to cover the light emitter, the binding layer, the light receiver, and part of the leadframe.

29. The method for manufacturing a photo sensing device as in claim 26, wherein the binding layer is made of adhesive material and directly attached between the light emitter and the light receiver.

30. The method for manufacturing a photo sensing device as in claim 26, wherein the step (b) and step (c) can be replaced by following steps:
(b) providing an adhesive binding layer, the bottom thereof attached on top surface of the light receiver;
(c) providing a light emitter on top front surface of the adhesive binding layer.

31. The method for manufacturing a photo sensing device as in claim 26, wherein the binding layer in step (b) is made material transparent to light emitted from the light emitter.

32. The method for manufacturing a photo sensing device as in claim 26, wherein the thickness of the binding layer in step (b) depends on the designed spreading range of light emitted from the light emitter.

33. The method for manufacturing a photo sensing device as in claim 26, further comprising a step after step (d):
providing a second encapsulating epoxy arranged within the sealing shell and covering the light emitter, the encapsulating epoxy, the light receiver, and part of the leadframe.

34. The method for manufacturing a photo sensing device as in claim 26, wherein the leadframe can be component of an IC circuit, a chipset, a PCB or a microprocessor, or component of combination thereof.

* * * * *